(12) United States Patent
Born et al.

(10) Patent No.: US 12,255,593 B2
(45) Date of Patent: Mar. 18, 2025

(54) TRANSIMPEDANCE AMPLIFIER (71) Applicant: Semtech Corporation, Camarillo, CA (US)

(72) Inventors: Christopher John Born, Bristol (GB); Matthew George Hagman, Gatineau (CA); Darrell Iaian Smith, Herfordshire (GB)

(73) Assignee: Semtech Corporation, Camarillo, CA (US)

( * ) Notice: Subject to any disclaimer, the term of this patent is extended or adjusted under 35 U.S.C. 154(b) by 597 days.

(21) Appl. No.: 17/648,897

(22) Filed: Jan. 25, 2022

(65) Prior Publication Data
US 2023/0238930 A1  Jul. 27, 2023

(51) Int. Cl.
| | |
|---|---|
| H03F 3/08 | (2006.01) |
| H03F 3/45 | (2006.01) |
| H03G 3/30 | (2006.01) |
| H04B 10/67 | (2013.01) |
| H03F 1/34 | (2006.01) |
| H03F 1/56 | (2006.01) |

(52) U.S. Cl.
CPC ....... *H03F 3/45475* (2013.01); *H03G 3/3036* (2013.01); *H04B 10/673* (2013.01);
(Continued)

(58) Field of Classification Search
CPC .......... H03F 3/45475; H03F 2200/372; H03F 2200/151; H03F 2200/301; H03F 2200/36;
(Continued)

(56) References Cited

U.S. PATENT DOCUMENTS

| | | | | |
|---|---|---|---|---|
| 7,902,900 B2* | 3/2011 | Liu | ............... | H03F 3/08 327/109 |
| 8,674,770 B2* | 3/2014 | Takiba | ............... | H03F 3/082 330/308 |

(Continued)

FOREIGN PATENT DOCUMENTS

JP       2004-159195 A      6/2004

OTHER PUBLICATIONS

Extended European Search Report for EP Patent Application No. 22208531.8 dated Jun. 23, 2023 (15 pages).
(Continued)

*Primary Examiner* — Khanh V Nguyen
(74) *Attorney, Agent, or Firm* — Alston & Bird LLP (57) ABSTRACT

A transimpedance amplifier (TIA) for converting an input current at an input node into an output voltage at an output node, the TIA comprising: a first amplifier stage having a first input coupled to the input node and a first output; a feedback path between the first output and the first input; a second amplifier stage in the feedback path having a second input, the second input coupled to the first output of the first amplifier stage; a feedback resistor in the feedback path coupled between an output of the second amplifier stage and first input of the first amplifier stage; and an output stage, comprising: a load resistor coupled between a reference voltage node and a T-coil, the T-coil comprising first and second inductors coupled in series at an inductor node, the T-coil coupled between the first output and the load resistor, the inductor node coupled to the output node of the TIA.

21 Claims, 8 Drawing Sheets

(52) U.S. Cl.
CPC .................. *H03F 1/34* (2013.01); *H03F 1/56* (2013.01); *H03F 2200/372* (2013.01); *H03G 2201/103* (2013.01)

(58) Field of Classification Search
CPC ...... H03F 2200/75; H03F 3/082; H03F 3/087; H03F 1/086; H03F 1/56; H03F 3/68; H03G 3/3036; H03G 2201/103; H04B 10/673; H04B 10/291; H04B 10/25891
USPC .................................................. 330/59, 308
See application file for complete search history.

(56) References Cited

U.S. PATENT DOCUMENTS 10,826,448 B2 * 11/2020 Fabiano .............. H03F 3/45179
2012/0326788 A1 12/2012 Cui et al.

OTHER PUBLICATIONS

Emami, Azita et al., "*High-Speed Optical Links*", 2019 IEEE Customer Integrated Circuits Conference (CICC), Apr. 14, 2019, pp. 1-103.

Knapp, H et al., "*15 GHz Wideband Amplifier with 2.8 dB Noise Figure in SiGe Bipolar Technology*", 2001 IEEE Radio Frequency Integrated Circuits (RFIC) Symposium. Digest of Papers, Phoenix, AZ, May 2001, pp. 287-290.

Shekhar et al., "*Bandwidth Extension Techniques for CMOS Amplifiers*", IEEE Journal of Solid-State Circuits, vol. 41, No. 11, Nov. 2006, pp. 2424-2439.

Paramesh, Jeyanandh et al., "*Analysis of the Bridged T-Coil Circuit Using the Extra-Element Theorem*", IEEE Transactions on Circuits and Systems II: Express Briefs, vol. 53, No. 12, Dec. 2006, pp. 1408-1412.

* cited by examiner

TRANSIMPEDANCE AMPLIFIER

TECHNICAL FIELD

The present disclosure relates to improvements in transimpedance amplifiers TIAs), in particular to TIAs driving a load.

BACKGROUND

In an optical data link, information is often encoded by modulating the amplitude of an optical signal which propagates through an optical fibre to a receiver at the end of the link. A photodiode in the receiver generates an electrical current which is proportional to the optical signal amplitude. This current is amplified and converted to a voltage signal which can then be further amplified and processed to determine the data pattern which has been received. A transimpedance amplifier (TIA) may be used to implement this current to voltage conversion.

To increase the rate at which data is sent across communications networks, the rate of amplitude modulation of optical signals can be increased. Higher modulation rates require higher bandwidth components in the receiver in order to faithfully reproduce the transmitted signal without introducing interference between consecutive data symbols (inter symbol interference). An optimum receiver bandwidth is typically between 60% and 70% of the symbol rate. Since optical signals are attenuated as they propagate through an optical fibre, the amplitude of signals arriving at a receiver can be very small.

To aid in the receiver determining the data pattern correctly, it is advantageous to minimise the noise added by the TIA to the received signal whilst maintaining sufficient bandwidth.

SUMMARY

According to a first aspect of the disclosure, there is provided a transimpedance amplifier (TIA) for converting an input current at an input node into an output voltage at an output node, the TIA comprising: a first amplifier stage having a first input coupled to the input node and a first output; a feedback path between the first output and the first input; a second amplifier stage in the feedback path having a second input, the second input coupled to the first output of the first amplifier stage; a feedback resistor in the feedback path coupled between an output of the second amplifier stage and first input of the first amplifier stage; and an output stage, comprising: a load resistor coupled between a reference voltage node and a T-coil, the T-coil comprising first and second inductors coupled in series at an inductor node, the T-coil coupled between the first output and the load resistor, the inductor node coupled to the output node of the TIA.

The T-coil may be a bridged T-coil. In which case, the T-coil may further comprises a bridge capacitor coupled between the first output and the load resistor.

The first reference voltage node may be a supply voltage node.

The first amplifier stage may comprise a transconductance amplifier.

The first amplifier stage may comprise a common emitter amplifier comprising: a first bipolar junction transistor (BJT), having: a first base coupled to the first input of the first amplifier stage; a first emitter coupled to a second reference voltage node; and a first collector coupled to the first output of the first amplifier stage.

The first amplifier stage may comprise a cascoded common emitter amplifier. The cascoded common emitter amplifier may comprise a common emitter BJT having a first base coupled to the first input, a first emitter coupled to a second reference voltage, and a first collector; a cascode BJT having a second base coupled to a cascode bias voltage node, a second emitter coupled to the first collector, and a second collector coupled to the first output.

The first amplifier stage may comprise: a first BJT having a first base coupled to the first input, a collector coupled to the first output, and a first emitter; a second BJT having a second base coupled to a second reference voltage node, a second collector coupled to a third reference voltage node, and a second emitter; and a current source, the first and second emitters coupled to the current source.

The second amplifier stage preferably has a voltage gain of approximately 1.

The second amplifier stage may comprise an emitter follower amplifier comprising: a second BJT, having a second base coupled to the first output of the first amplifier stage; a second collector coupled to a third reference voltage node; and a second emitter coupled to the feedback resistor.

The first amplifier stage may comprise a common source amplifier. The common source amplifier may comprise a first CMOS device having: a first gate coupled to the first input of the first amplifier stage; a first source coupled to a second reference voltage node; and a first drain coupled to the first output of the first amplifier.

The second amplifier stage may comprise a source follower amplifier. The source follower amplifier may comprise a second CMOS device having: a second gate coupled to the first output of the first amplifier stage; a second source coupled to the feedback resistor; and a second drain coupled to a second reference voltage node.

The TIA may comprise a third amplifier stage coupled to the output node. The third amplifier stage may comprise a limiting amplifier or a variable gain amplifier (VGA).

The TIA may further comprise a second transconductance amplifier coupled to input node and configured to generate the input current.

According to another aspect of the disclosure, there is provided an optical receiver comprising: a photodiode for generating the input current; and the TIA described above. The photodiode is preferably reverse biased.

According to another aspect of the disclosure, there is provided an electronic device comprising the TIA as described above.

The electronic device may be one of an optical receiver, a Geiger-Muller tube, a photo multiplier tube or an accelerometer.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the present disclosure will now be described by way of non-limiting examples with reference to the drawings, in which.

DESCRIPTION OF EMBODIMENTS

Figure 1:
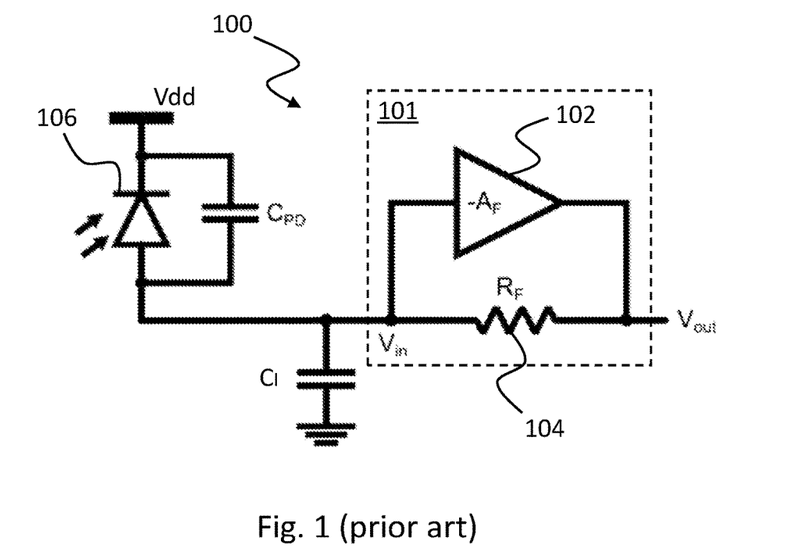
FIG. 1 is a schematic diagram of a known optical receiver.

FIG. 1 is a schematic diagram of an optical receiver 100 comprising a known shunt feedback transimpedance amplifier (TIA) 101 and a photodiode 106. The TIA 101 comprises an inverting amplifier 102 (referred to interchangeably herein as a feedback amplifier), having a gain of $-A_F$, and a feedback resistor 104, having resistance $R_F$. The feedback resistor 104 is coupled between an input and an output of the inverting amplifier 102. The TIA 101 has an inherent input capacitance $C_I$. When arranged in an optical receiver, an input of the TIA 101 is coupled to an anode of a photodiode 106. An anode of the photodiode 106 is connected to a supply voltage Vdd. As noted in more detail below, the TIA 101 may be used to convert any current into a voltage and is not limited to converting the current generated from the photodiode 106.

The photodiode 106 has an inherent parasitic capacitance $C_{PD}$. The current $I_{PD}$ through the photodiode 106 is proportional to the amplitude of light incident the photodiode 106. This current, $I_{PD}$, flows into the TIA 101, which in turn generates an output voltage Vout at its output.

The contribution of the feedback resistor 104 to the input referred noise (IRN) of the TIA 101 may be approximated by the following equation.

$$I_n = \sqrt{\frac{4kT}{R_F}}$$

As such, the IRN of the TIA 101 can be reduced or minimised by increasing the value $R_F$ of the feedback resistor 104. However, for a given feedback gain $A_F$, increasing the value $R_F$ of the feedback resistor 104 also leads to an undesirable reduction in bandwidth of the TIA 101, as explained below.

The parasitic capacitance $C_{PD}$ of the photodiode 106 and the input capacitance $C_I$ of the TIA 101 limit the bandwidth of the TIA 101. Assuming the inverting amplifier 102 has a flat frequency response, the frequency dependent transfer function between the input current $I_{PD}$ and the output voltage Vout can be approximated by the following equation.

$$\frac{V_{out}}{I_{PD}}(s) = -R_T \frac{1}{1 + s/\omega_p}$$

where $$R_T = \frac{A_F}{1 + A_F} R_F$$

$$\omega_p = \frac{1 + A_F}{R_F C_T}$$

$$C_T = C_I + C_{PD}$$

From the above, it can be seen that the bandwidth $\omega_p$ of the TIA 101 for a given feedback resistance $R_F$, parasitic capacitance $C_{PD}$ and input capacitance $C_I$ can be increased by increasing the open loop feedback gain $A_F$ associated with the inverting amplifier 102.

In practice, the inverting amplifier 102 will have limited bandwidth, with the product of the gain $A_F$ and the bandwidth $\omega_p$ being approximately constant for a given process technology. This leads to a corresponding limitation in the overall bandwidth of the TIA 101. Assuming the inverting amplifier 102 has as single dominant pole, this results in the TIA 101 having a second order frequency response. If the amplifier 102's dominant pole frequency is too low, the closed loop response of the TIA 101 will be underdamped and the pulse response will exhibit ringing, leading to inter-symbol interference. It can be shown that to maintain a Q factor of $1/\sqrt{2}$ (i.e. Butterworth response), the bandwidth $\omega_A$ of the amplifier 102 should satisfy the below equation.

$$\omega_A \geq \frac{2A_F}{R_F C_T}$$

Which in turn leads to an overall −3 dB bandwidth of:

$$BW_{3dB} = \frac{1}{2\pi} \frac{\sqrt{2A_F(A_F + 1)}}{R_F C_T}$$

As such, to maintain high overall bandwidth of the TIA 101 whilst increasing the feedback resistance $R_F$ of the TIA 101 (to lower IRN), it is desirable to increase the feedback amplifier gain bandwidth product ($A_F \cdot \omega_A$).

Figure 2:
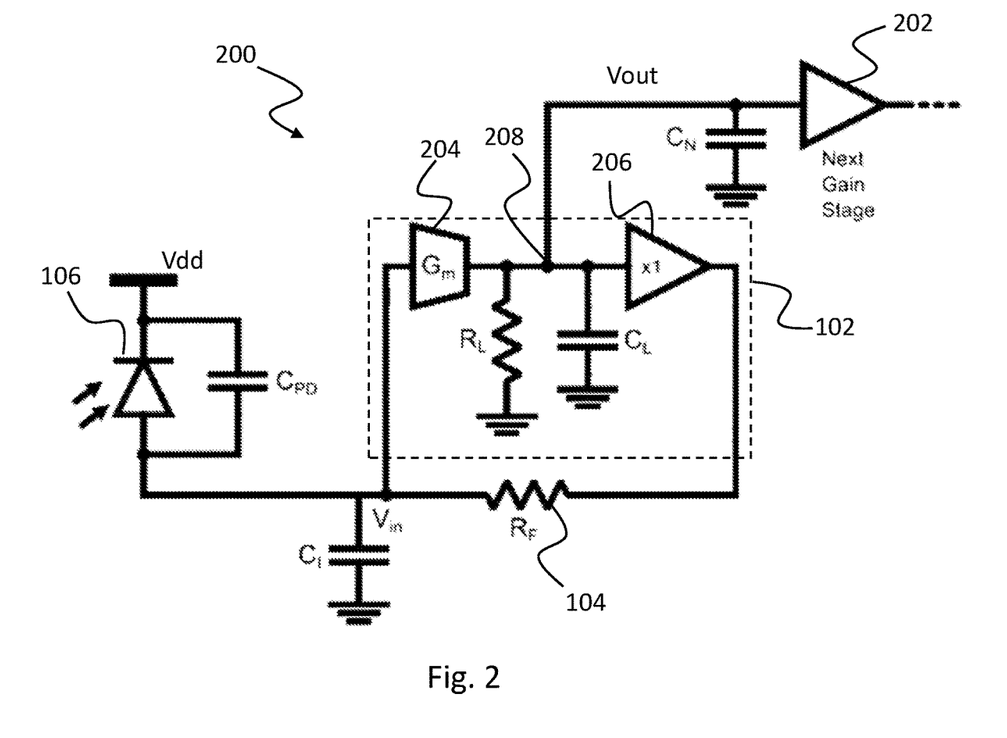
FIG. 2 shows an exemplary implementation of the optical receiver of FIG. 1.

FIG. 2 shows a system 200 comprising a known example implementation of the optical receiver 100 shown in FIG. 1, where like parts have been given like numerals. The system comprises the optical receiver 100 having its output Vout provided into a next amplifier stage 202.

The inverting amplifier 102 comprises a first amplifier stage 204 comprising a transconductance amplifier and a second amplifier stage 206 comprising a buffer. An output of the first amplifier stage 204 is coupled to the second amplifier stage 206 at an output voltage node 208. The first amplifier stage 204 generates a current which is converted back to an output voltage Vout at the output voltage node 208 by a load resistance $R_L$ coupled between the output voltage node 208 and a reference voltage (in this case ground). This results in an amplifier gain $A_F = -GmR_L$. The second amplifier stage 206 is configured to drive the feedback resistor RF with a low output impedance. The second amplifier stage 206 preferably has a gain of around 1. In practice, however, the second amplifier stage 206 may have a gain of slightly less than 1 (for example 0.8 or 0.9). An input of the next amplifier stage 202 is coupled to the output voltage node 208, such that the next amplifier stage 202 is driven by the output voltage Vout.

The next amplifier stage 202 has an parasitic input capacitance $C_N$, represented in FIG. 2 as being coupled between the input of the next amplifier stage 202 and a reference voltage (in this case ground). Likewise, capacitance $C_L$ associated with the input of the second amplifier stage and the transconductance amplifier is represented as being coupled between the input of the second amplifier stage 206 and a reference voltage (in this case ground).

The bandwidth $\omega_A$ of the inverting amplifier 102 is limited by the combination of the input capacitance $C_N$ of the next amplifier stage 202 and the capacitance $C_L$ associated with the inverting amplifier 102 and can be defined as follows.

$$\omega_A = \frac{1}{R_L(C_L + C_N)}$$

For any given process technology, there is a lower limit achievable for these capacitances $C_N$, $C_L$. And, whilst reducing the load resistance $R_L$ will result in an increase in bandwidth $\omega_A$, an increase in the gain Gm of the first amplifier stage 204 is required to achieve a given target $A_F$, which will in turn increase power consumption in the amplifier 102 and increase input capacitance $C_I$ of the first amplifier stage 204. Having a larger gain Gm will also tend to require the first amplifier stage 204 to have larger components to accommodate the increased current flow, in turn increasing cost and circuit area.

Embodiments of the present disclosure aim to address or at least ameliorate one or more of the above issues by removing or at least reducing the effect of the input capacitance $C_N$ of the next gain stage 202 on the inverting amplifier 102. In doing so, the gain bandwidth product ($\omega_A \cdot A_F$) of the inverting amplifier 102 can be extended. This enables the overall bandwidth of the TIA 101 to be extended for a given feedback resistance $R_F$. Conversely, a larger feedback resistor $R_F$ can be used for a given bandwidth $\omega_A$, which in turn will lead to a reduction of IRN in the TIA 102.

Figure 3:
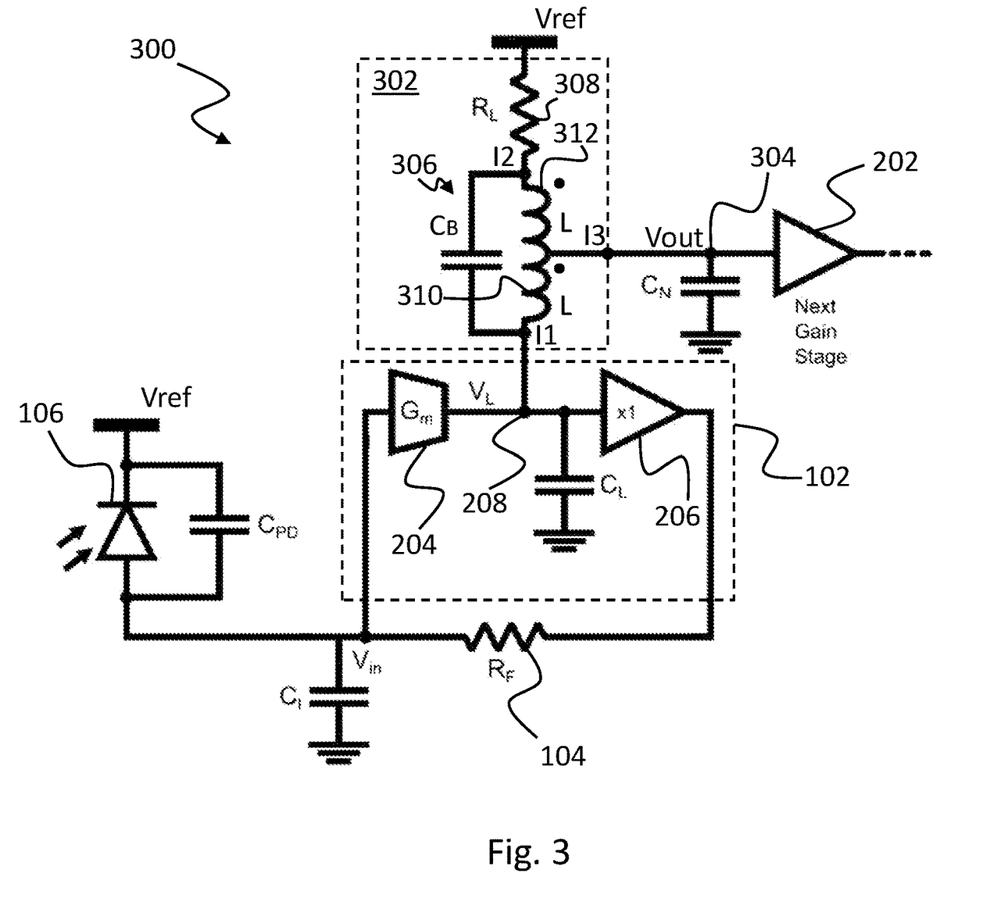
FIG. 3 is a schematic diagram of an optical receiver according to embodiments of the present disclosure.

FIG. 3 schematically illustrates an optical receiver 300 according to embodiments of the present disclosure which aims to achieve this effect. Like parts of the optical receiver 300 and the optical receiver 200 of FIG. 2 have been given like numerals. As such, like the optical receiver 200 shown in FIG. 2, the optical receiver 300 comprises the photodiode 106, the TIA 101 (comprising first and second amplifier stage 204, 206), and the next gain stage 202.

In contrast to the optical receiver 200 of FIG. 2, the optical receiver 300 shown in FIG. 3 comprises an output stage 302 coupled between the output voltage node 208 of the TIA 102 and an input node 304 of the next gain stage 102.

The output stage 302 comprises a T-coil 306 and a load resistor 308 having resistance $R_L$. The T-coil 306 comprises first and second inductors 310, 312 coupled in series between a first inductor node I1 and a second inductor node I2. The first and second inductors 310, 312 are coupled to one another at a third inductor node I3 which itself is coupled to the input node 304 of the next gain stage 202. The first inductor node I1 is coupled to the voltage output node 208 of the feedback amplifier 102. The load resistor 308 is coupled between the second inductor node I2 and a reference voltage Vref, which in some embodiments is a supply voltage.

In the embodiments described herein, the T-coil 306 is a bridged T-coil. As such, the T-coil 306 further comprises a bridging capacitor coupled between the first and second inductor nodes I1, I2 and thus arranged in parallel to the series coupled inductors 310, 312. The bridging capacitor $C_B$ ensures that the input impedance of the T-coil is constant and resistive over a large frequency range. It will, however, be appreciated that in other embodiments the bridging capacitor $C_B$ may be omitted. Whilst such an arrangement is not as effective, the T-coil without the bridging capacitor $C_B$ will still act to improve bandwidth of the TIA 102.

In the embodiment described herein, the inductors 310, 312 of the T-coil have the same inductance L. It will, however, be appreciated that in other embodiments the inductors 310, 312 may have different inductance values.

Figure 4:
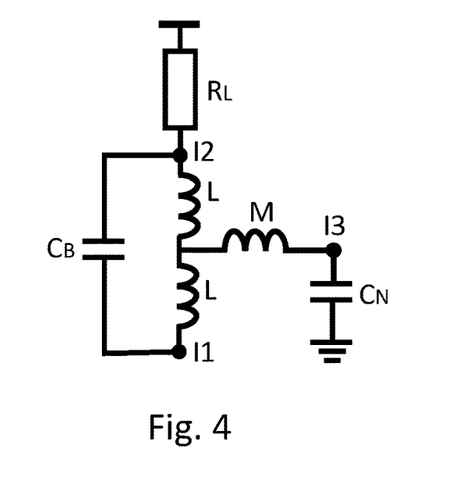
FIG. 4 illustrates an equivalent circuit for a T-coil shown in FIG. 3.

FIG. 4 shows an equivalent circuit 400 for the output stage 302. T-coils are known generally in the art and so their theory of operation will not be described in detail here. In summary, however, each of the inductors 310, 312 of the T-coil 306 has an inductance L (the differential inductance of the T-coil therefore being 2L) and the inductors 310, 312 share a mutual inductance M. Values of inductance L of each coil, the mutual inductance M, and the bridging capacitor $C_B$ can be selected such that the impedance measured at the first inductor node I1 is a constant resistance across a large frequency range. To achieve this condition, it can be shown that the following equations need to be satisfied.

$$L = \frac{R_L^2 C_N}{2}$$

$$C_B = \frac{C_N(1 + \tan^2\theta)}{16} \ldots$$

Where $\theta$ is the pole angle of the T-coil, which is equal to 30 degrees for maximally flat envelope delay.

$$M = R_L^2 C_N - \frac{L}{2}$$

Thus, by arranging the T-coil 306 between the impedance seen at the input node 304 of the next amplifier stage 202 and the voltage output node 208 of the inverting amplifier 102, the parasitic capacitance $C_N$ of the next amplifier stage 202 can be hidden from the first amplifier stage 204. The impedance at the voltage output node 208, seen by the TIA 102, is both constant and resistive.

With the impact of the parasitic capacitance $C_N$ of the next amplifier stage 202 removed, the bandwidth $\omega_A$ of the feedback amplifier 102 can be defined by the following equation.

$$\omega_A = \frac{1}{R_L C_L}$$

With a reduced overall capacitance, the bandwidth $\omega_A$ of the feedback amplifier 102 is thus extended for a given feedback resistance $R_F$. Likewise, for a given bandwidth $\omega_A$, the load resistance $R_L$ can be increased which in turn will lead to a larger feedback gain $A_F$.

Figure 5:
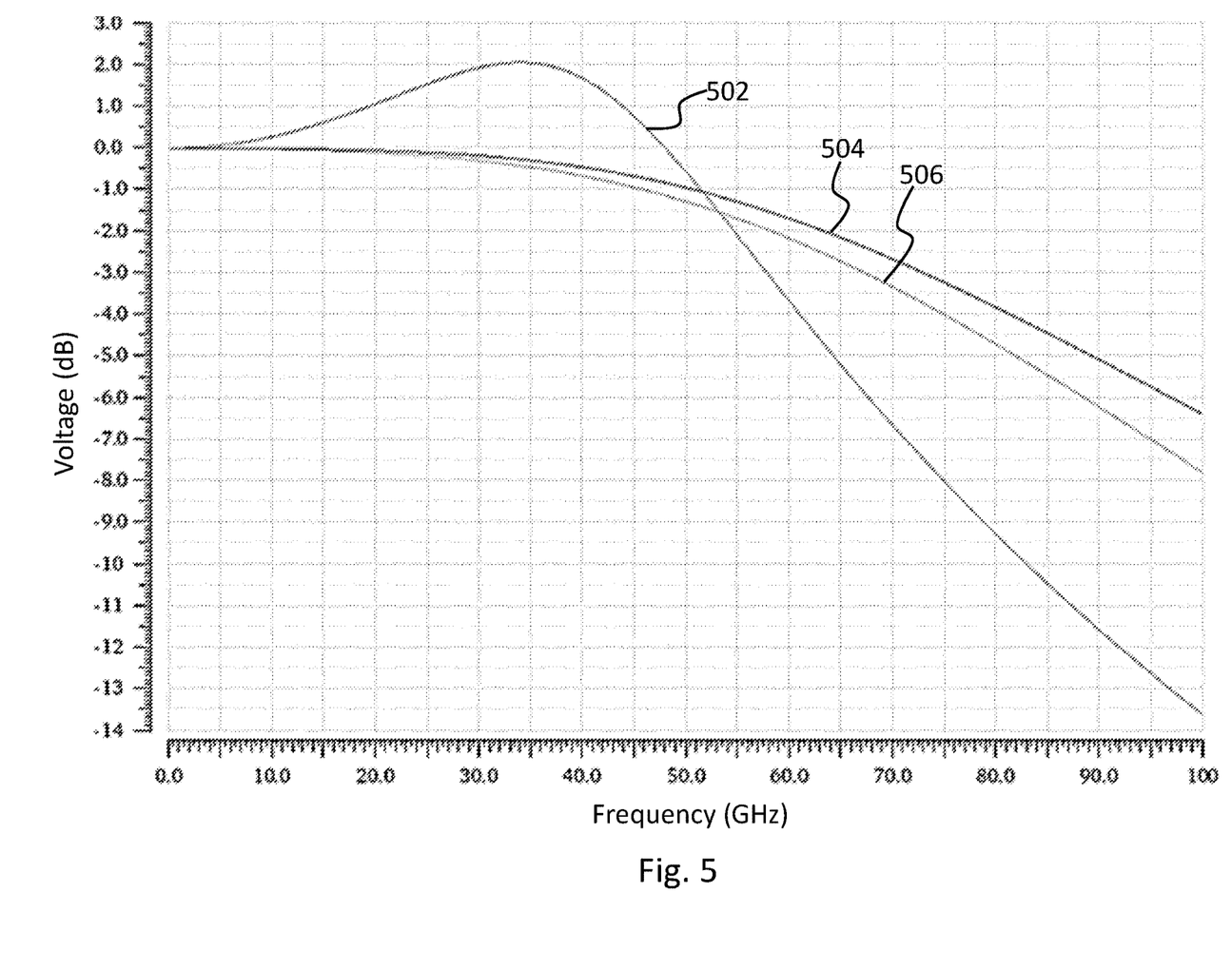
FIG. 5 is a graph showing the frequency response of the amplifiers of the receivers of FIGS. 2 and 3.

FIG. 5 graphically illustrates this extension of bandwidth. Specifically, FIG. 5 shows example frequency responses with and without the T-coil 306 present between the voltage output node 208 and the input node 304 of the next amplifier stage 202, each receiver 200, 300 having the following component values, $C_T$ being the total input capacitance ($C_I + C_{PD}$).

| Component | Value |
| --- | --- |
| $R_F$ | 300Ω |
| $R_L$ | 50Ω |
| $C_T$ | 200fF |
| $C_L$ | 30fF |
| $C_N$ | 60fF |
| T-coil pole angle | 30° |

The curve 402 depicts the frequency response of the prior art receiver 200 (without T-coil 304) shown in FIG. 2, as seen at the voltage output node 208. The curve 404 depicts the frequency response of the receiver 300 shown in FIG. 3 with the T-coil 306 as seen at the voltage output node 208. The curve 406 depicts the frequency response of the receiver 300 shown in FIG. 3 as seen at the input node 304 of the next gain stage 202.

It can be seen that without the T-coil 304, the large parasitic capacitance ON of the next amplifier stage 202 loading the feedback amplifier 102 causes 2 dB of frequency response peaking and a steep roll off above this peak. Adding the T-coil 304 as shown in FIG. 3 at the output of the first amplifier stage 204 flattens and extends the frequency response when compared with that of the receiver 200.

It will be appreciated that the addition of the T-coil 306 introduces an additional 2nd order filter between the voltage output node 208 and the input node 304 of the next amplifier stage 202. However, the inventors have found the cut-off frequency of this filter to be high enough to not significantly affect the overall frequency response of the receiver 300, as is also evident from FIG. 5.

In addition to the above, the increase in gain bandwidth product of the feedback amplifier 102 due to coupling the T-coil 304 specifically to the output of the first amplifier stage 204 of the feedback amplifier 102 allows for the use of a larger feedback resistor $R_F$ for a given overall bandwidth of the TIA 101. This results in the IRN of the TIA 101 being significantly reduced when compared to prior art amplifiers, such as the receiver 200 shown in FIG. 2.

To show the difference in IRN between receivers 200, 300 with and without the T-coil 304 present, a simulation was undertaken for the receiver 200, choosing values of $R_F$ and $R_L$ for the receiver 200 that led to a frequency response that approximately matched that of the receiver 300 of FIG. 3.

Figure 6:
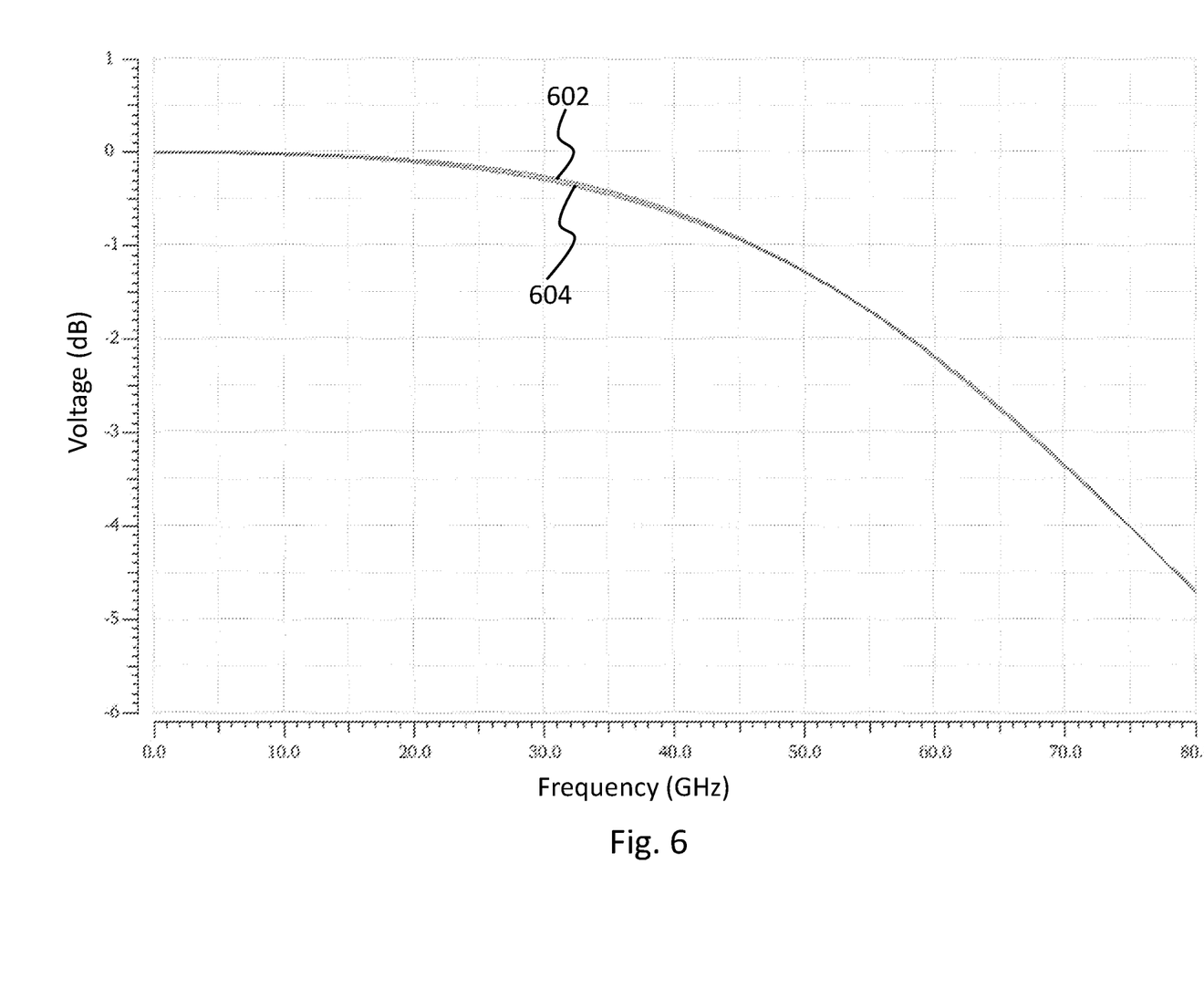
FIG. 6 is a graph showing the input referred noise for amplifiers of the receivers of FIGS. 2 and 3.

FIG. 6 graphically illustrates these closely matched frequency responses 602, 604 for the receiver 200 and the receiver 300 respectively, with the following component values.

| Component | Without T-coil | With T-coil |
| --- | --- | --- |
| $R_F$ | 110Ω | 300Ω |
| $R_L$ | 21Ω | 50Ω |
| $C_T$ | 200fF | 200fF |
| $C_L$ | 30fF | 30fF |
| $C_N$ | 60fF | 60fF |
| T-coil pole angle | 30° | 30° |

With the above component values, the IRN, integrated up to 67 GHz (the −3 dB bandwidth) is 2.04 uArms for the receiver 200 without the T-coil 304 and 3.13 uArms without the T-coil. This illustrates a substantial reduction in IRN contribution (approximately 35%) from the feedback resistor $R_F$ of the receiver 300 (with the T-coil 304) when compared to that of the receiver 200 (without the T-coil).

Various implementations of the receiver 300 will now be described with reference to FIGS. 7 to 10. In each example, the photodiode 106, output stage 302 and next amplifier stage 202 are substantially similar to those shown in FIG. 3 and so have been denoted with similar reference numerals.

Figure 7:
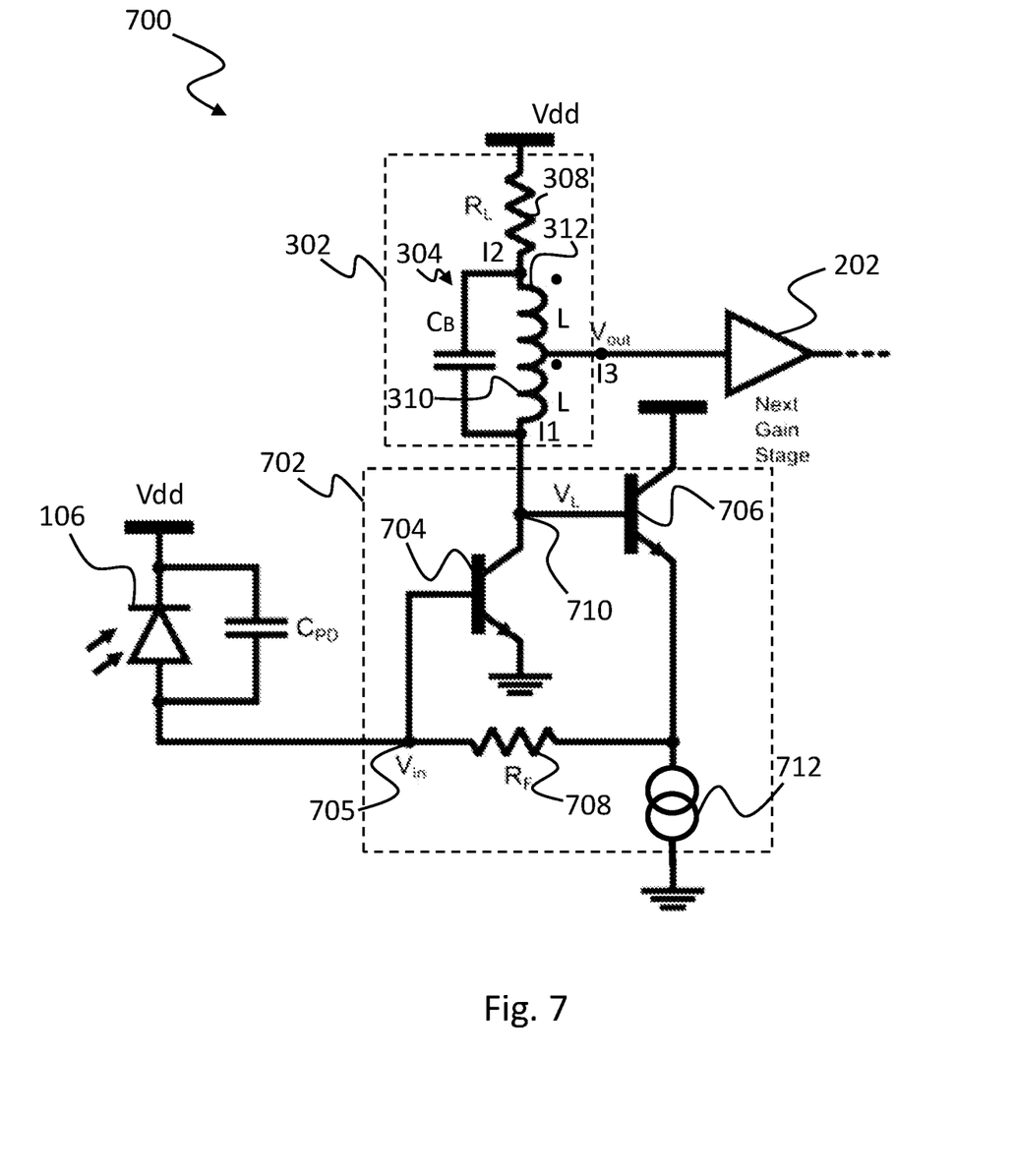
FIGS. 7 to 9 show circuit diagrams of bipolar junction transistor implementations of the receiver shown in FIG. 3.

Referring first to FIG. 7 a receiver 700 comprises a TIA 702 implemented using bipolar junction transistors. The TIA 702 comprises a first bipolar junction transistor (BJT) 704, a second BJT 706 and a feedback resistor 708. The first BJT 704 is arranged as a common emitter amplifier, with its base coupled to an input node 705 of the TIA 702 (and therefore the anode of the photodiode 106), its emitter coupled to a reference voltage (in this case ground), and its collector coupled to a voltage output node 710 of the TIA 702. The first BJT 704 thus acts as a transconductance amplifier. The voltage output node 706 of the TIA 702 is coupled to the first inductor node I1 of the T-coil 304. The second BJT 706 is arranged as an emitter follow amplifier, with its base coupled to the voltage output node 710, its emitter coupled to each of the feedback resistor 708 and a current source 712, which itself is coupled to a reference voltage (in this case ground). A collector of the second BJT 706 is coupled to a reference voltage (such as a biasing voltage or a supply voltage). The feedback resistor 708 is coupled between the emitter of the second BJT 706 and the base on the first BJT 704.

Figure 8:
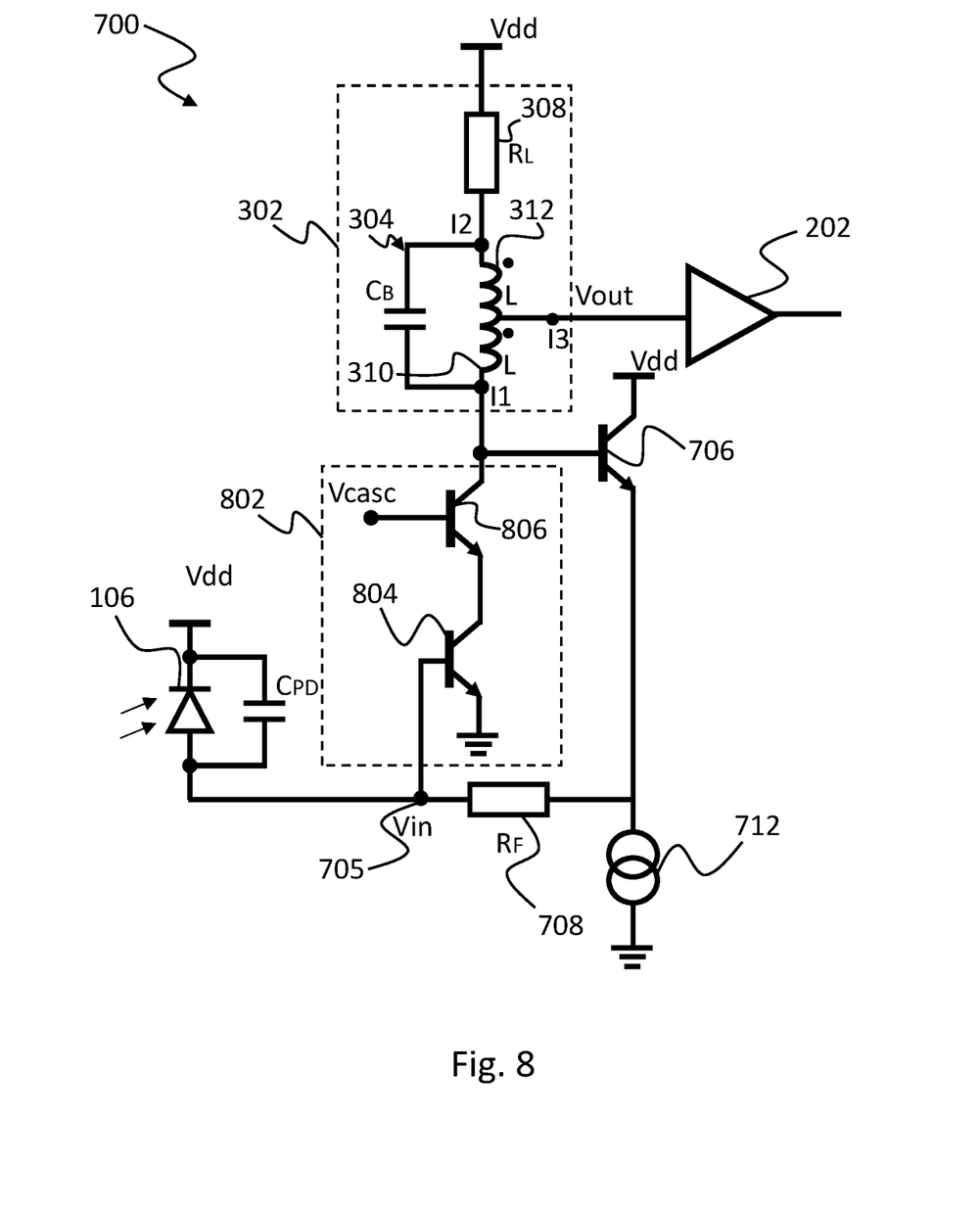

FIG. 8 shows a receiver 800 which is a variation of the receiver 700 shown in FIG. 7, in which the first BJT 704 has been replaced by a cascoded common emitter amplifier 802 comprising a common emitter BJT 804 and a cascode BJT 806. The common emitter BJT 804 has a base coupled to the input node 705, an emitter coupled to a reference voltage (in this case ground), and a collector coupled to an emitter of the cascode BJT 806. The cascode BJT 806 has a base coupled to a cascode bias voltage Vcasc and a collector coupled to the voltage output node 710 and the base of the second BJT 706. Thus the first and cascode BJTs 804, 806 operate as a cascoded common emitter amplifier as is known in the art.

Figure 9:
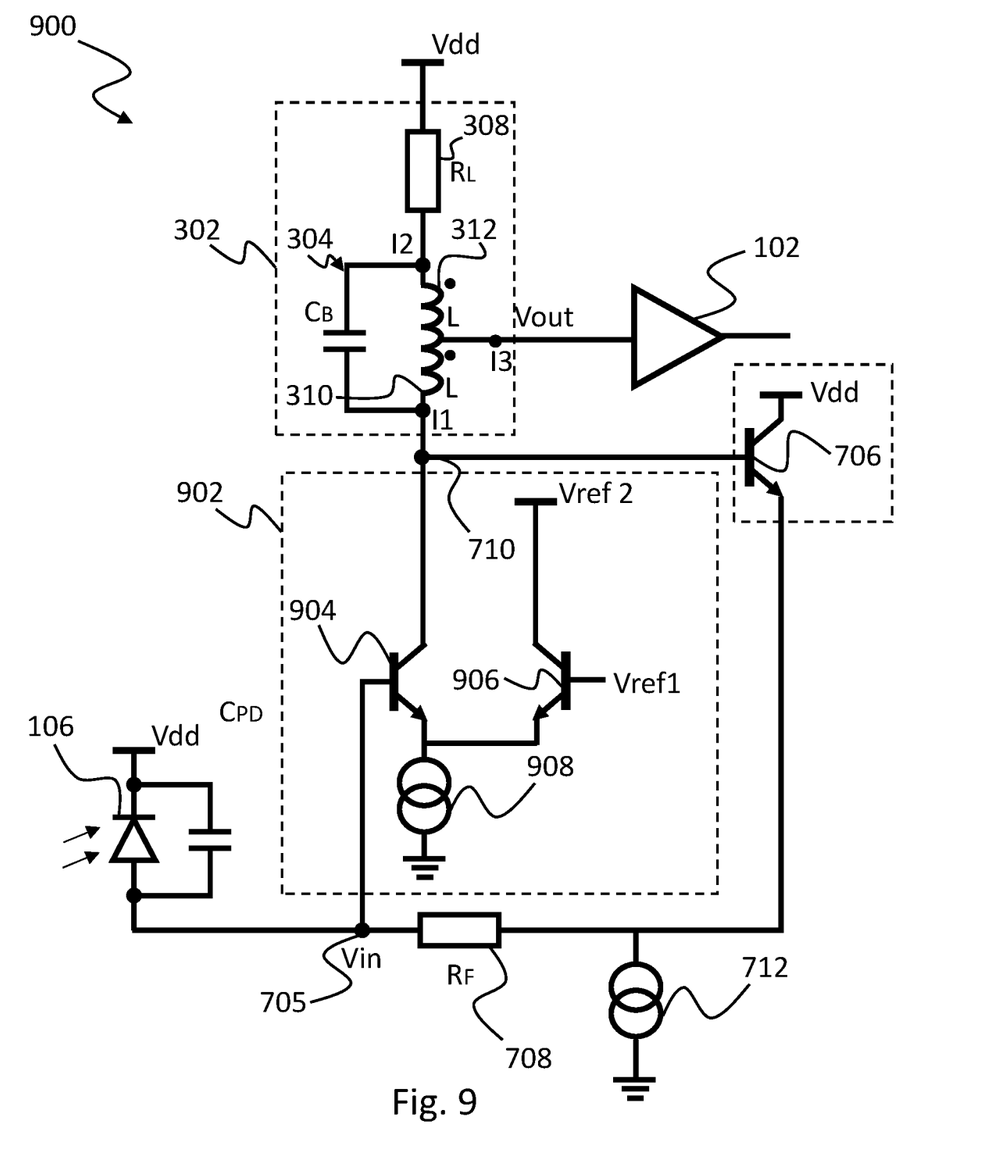

FIG. 9 shows a receiver 900 which is a further variation of the receiver 700 shown in FIG. 7, in which the first BJT 704 has been replaced by a raised front end arrangement 902, comprising a first BJT 904 and a second BJT 906 arranged as a differential or long tailed pair. The first BJT 704 has a base coupled to the input node 705, and a collector coupled to the voltage output node 710. The second BJT 906 has its base connected to a first reference voltage Vref1 and its collector coupled to a second reference voltage Vref2. In the embodiment shown, the second reference voltage Vref2 is greater than the first reference voltage Vref1. The first reference voltage Vref1 may be chosen so as to be approximately equal to the mean input voltage Vin received at the input node 705.

The emitters of the first and second BJTs 904, 906 are coupled to a common current source 908 which itself is coupled to a further reference voltage (in this case ground). The raised front-end arrangement 902 thus operates as a transconductance amplifier.

Any of the bipolar implementation shown and described with reference to FIGS. 7 to 9 may in other embodiments be implemented in corresponding CMOS technology.

Figure 10:
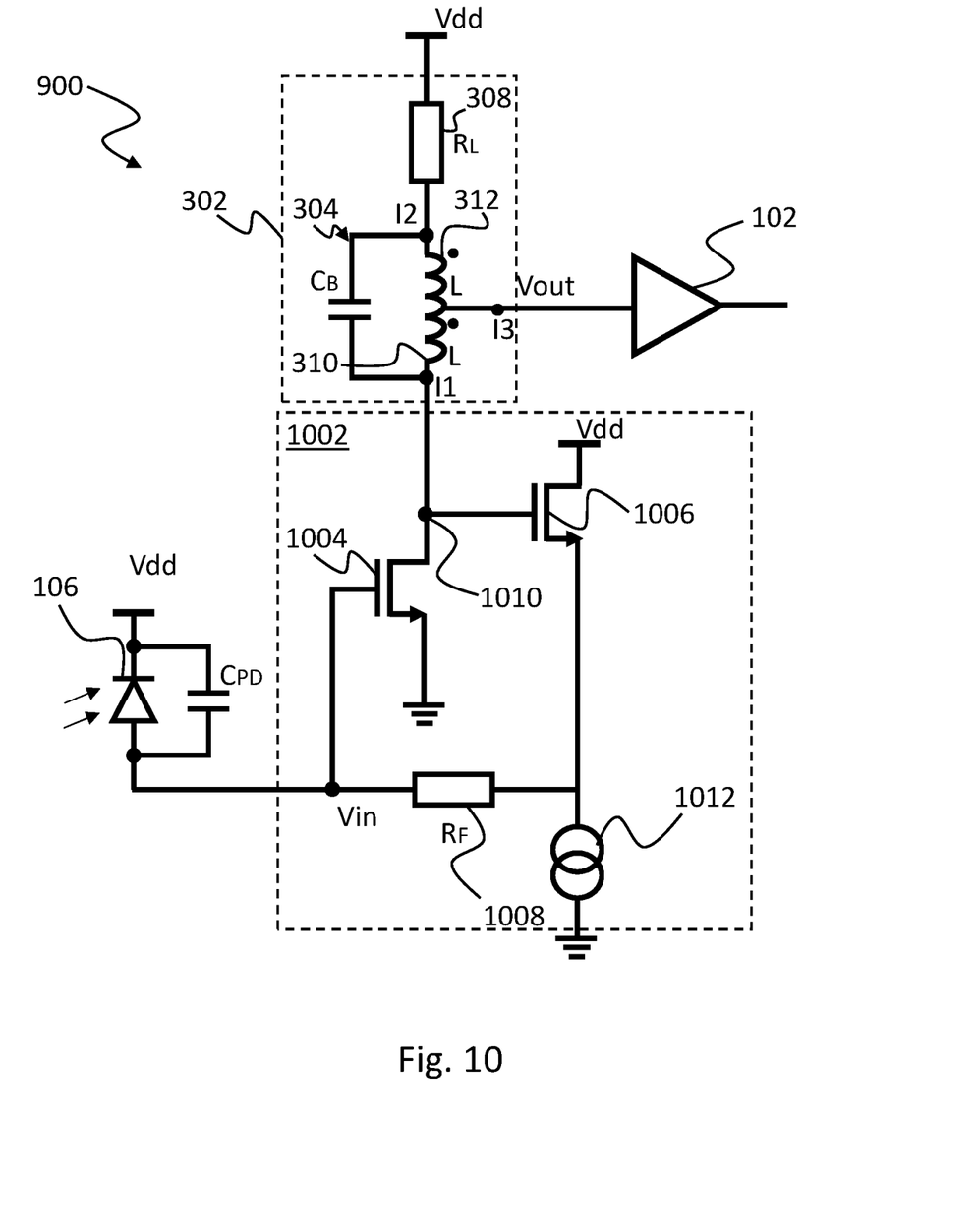
FIG. 10 shows a circuit diagram of a CMOS implementation of the receiver shown in FIG. 3.

FIG. 10 provides an example CMOS implemented receiver 1000 which is a CMOS equivalent to the receiver 700 shown in FIG. 7. The receiver 1000 comprises a TIA 1002 implemented using NMOS transistors. It will be appreciated that the TIA 1002 could equally be implemented using PMOS devices in other embodiments. The TIA 1002 comprises a first MOSFET 1004, a second MOSFET 1006 and a feedback resistor 1008. The first MOSFET 1004 is arranged as a common source amplifier, with its gate coupled to an input node 1005 of the TIA 1002 (and therefore the anode of the photodiode 106), its source coupled to a reference voltage (in this case ground), and its drain coupled to a voltage output node 1010 of the TIA 1002. The voltage output node 1006 of the TIA 1002 is coupled to the first inductor node I1 of the T-coil 304. The first MOSFET 1004 thus acts as a transconductance amplifier. The second MOSFET 1006 is arranged as a source follower amplifier, with its gate coupled to the voltage output node 1010, its source coupled to the feedback resistor 1008 and a current source 1012 which itself is coupled to a reference voltage (in this case ground). A drain of the second MOSFET 1006 is coupled to a reference voltage (such as a biasing voltage or a supply voltage. The feedback resistor 1008 is coupled between the source of the second MOSFET 1006 and the gate of the first MOSFET 1004.

It will be appreciated that the embodiments shown in FIGS. 8 and 9 can also be redesigned using CMOS devices, for example by replacement of each BJT with a CMOS transistor.

Whilst embodiments of the present disclosure are described as converting a current generated by a photodiode, the present disclosure is not limited as such. TIAs described herein may be used to convert any input current generated by any conceivable device. By way of non-limiting example, TIAs described herein may be used to convert an input current output from a Geiger-Muller tube, a photo multiplier tube, an accelerometer, and any other type of sensor which generates an input current. The skilled person will appreciate that TIAs are particularly useful converting signals from sensors that have a current response that is more linear than their voltage response. In addition, the TIAs described herein may be configured in combination with a transconductance amplifier so as to convert input voltages (instead of input currents). For example, an input voltage may be provided to a transconductance amplifier which may then output a current to be used as the input to one or more of the TIAs described herein.

Embodiments may be implemented in a host device, such as an optical module, which may itself be located in a server or other computing device.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A transimpedance amplifier (TIA) for converting an input current at an input node into an output voltage at an output node, the TIA comprising:
   a first amplifier stage having a first input coupled to the input node and a first output;
   a feedback path between the first output and the first input;
   a second amplifier stage in the feedback path having a second input, the second input coupled to the first output of the first amplifier stage;
   a feedback resistor in the feedback path coupled between an output of the second amplifier stage and first input of the first amplifier stage; and
   an output stage, comprising:
      a load resistor coupled between a reference voltage node and a T-coil, the T-coil comprising first and second inductors coupled in series at an inductor node, the T-coil coupled between the first output and the load resistor, the inductor node coupled to the output node of the TIA.

2. The TIA of claim 1, wherein the T-coil is a bridged T-coil, wherein the T-coil further comprises a bridge capacitor coupled between the first output and the load resistor.

3. The TIA of claim 1, wherein the first reference voltage node is a supply voltage node.

4. The TIA of claim 1, wherein the first amplifier stage comprises a transconductance amplifier.

5. The TIA of claim 1, wherein the first amplifier stage comprises a common emitter amplifier comprising:
   a first bipolar junction transistor (BJT), having:
      a first base coupled to the first input of the first amplifier stage;
      a first emitter coupled to a second reference voltage node; and
      a first collector coupled to the first output of the first amplifier stage.

6. The TIA of claim 1, wherein the first amplifier stage comprises a cascoded common emitter amplifier.

7. The TIA of claim 6, wherein the cascoded common emitter amplifier comprises:
   a common emitter BJT having a first base coupled to the first input, a first emitter coupled to a second reference voltage, and a first collector;
   a cascode BJT having a second base coupled to a cascode bias voltage node, a second emitter coupled to the first collector, and a second collector coupled to the first output.

8. The TIA of claim 1, wherein the first amplifier stage comprises:
   a first BJT having a first base coupled to the first input, a collector coupled to the first output, and a first emitter;
   a second BJT having a second base coupled to a second reference voltage node, a second collector coupled to a third reference voltage node, and a second emitter; and
   a current source, the first and second emitters coupled to the current source.

9. The TIA of claim 1, wherein the second amplifier stage has a voltage gain of approximately 1.

10. The TIA of claim 1, wherein the second amplifier stage comprises an emitter follower amplifier comprising:
    a second BJT, having:
       a second base coupled to the first output of the first amplifier stage;
       a second collector coupled to a third reference voltage node; and
       a second emitter coupled to the feedback resistor.

11. The TIA of claim 1, wherein the first amplifier stage comprises a common source amplifier.

12. The TIA of claim 11, wherein the common source amplifier comprises a first CMOS device having:
    a first gate coupled to the first input of the first amplifier stage;
    a first source coupled to a second reference voltage node; and
    a first drain coupled to the first output of the first amplifier.

13. The TIA of claim 1, wherein the second amplifier stage comprises a source follower amplifier.

14. The TIA of claim 13, wherein the source follower amplifier comprises a second CMOS device having:
    a second gate coupled to the first output of the first amplifier stage;

a second source coupled to the feedback resistor; and a second drain coupled to a second reference voltage node.

15. The TIA of claim 1, further comprising a third amplifier stage coupled to the output node.

16. The TIA of claim 15, wherein the third amplifier stage is a limiting amplifier or a variable gain amplifier (VGA).

17. The TIA of claim 1, wherein the first amplifier stage comprises a transconductance amplifier coupled to the input node and configured to generate the input current.

18. An optical receiver comprising:

a photodiode for generating the input current; and the TIA of claim 1.

19. The optical receiver of claim 18, wherein the photodiode is reverse biased.

20. An electronic device comprising the TIA of claim 1.

21. The electronic device of claim 20, wherein the electronic device is one of an optical receiver, a Geiger-Muller tube, a photo multiplier tube or an accelerometer.

* * * * *

UNITED STATES PATENT AND TRADEMARK OFFICE
CERTIFICATE OF CORRECTION

PATENT NO. : 12,255,593 B2
APPLICATION NO. : 17/648897
DATED : March 18, 2025
INVENTOR(S) : Christopher John Born et al.

It is certified that error appears in the above-identified patent and that said Letters Patent is hereby corrected as shown below:

On the Title Page

In Column 1, item (72), Inventors, Line 4, delete "Herfordshire" and insert -- Hertfordshire --, therefor.

Signed and Sealed this
Fifteenth Day of July, 2025

Coke Morgan Stewart
*Acting Director of the United States Patent and Trademark Office*